United States Patent [19]

Morrish

[11] Patent Number: 4,990,833
[45] Date of Patent: Feb. 5, 1991

[54] SELF-ADAPTING VERTICAL SCAN CIRCUIT FOR RASTER-SCANNED CATHODE RAY TUBE DISPLAYS

[75] Inventor: Andrew J. Morrish, Eastleigh, United Kingdom

[73] Assignee: International Business Machines Corporation, Armonk, N.Y.

[21] Appl. No.: 507,928

[22] Filed: Apr. 11, 1990

[30] Foreign Application Priority Data

Apr. 15, 1989 [GB] United Kingdom ............... 8908591

[51] Int. Cl.$^5$ .................. G09G 1/04; H03K 4/08; H03K 4/80
[52] U.S. Cl. ............................ 315/398; 307/228; 328/181
[58] Field of Search ............. 315/348, 403; 358/140; 307/328; 328/181

[56] References Cited

U.S. PATENT DOCUMENTS 4,490,653 12/1984 Olmstead .................. 315/403

Primary Examiner—Gregory C. Issing
Attorney, Agent, or Firm—Robert M. Trepp

[57] ABSTRACT

A vertical scan circuit for a display is described which allows automatic picture height and centering. The deflection voltages at the start and end of active video time, are stored by capacitors fed via switches activated by signal pulses. These stored voltages are compared to margin reference voltages Vtmref and Vbmref which correspond to the desired top and bottom of the picture as displayed for a particular monitor. The maximum deflection voltage on flyback (Vmax) and the slope of the signal (dv/dt) are adjusted so that the top margin voltage (Vtm) and the bottom margin voltage (Vbm), bear desired relationships to these reference voltages (Vtmref and Vbmref respectively), thus ensuring that the top and bottom of the picture as displayed remains constant for different screen formats.

10 Claims, 4 Drawing Sheets

4,990,833

SELF-ADAPTING VERTICAL SCAN CIRCUIT FOR RASTER-SCANNED CATHODE RAY TUBE DISPLAYS

BACKGROUND OF THE INVENTION

1. Field of the Invention

This invention relates to a vertical scan circuit for a raster-scanned cathode ray tube (CRT) display, in particular to a circuit which allows automatic picture height adjustment and centering for different screen formats.

2. Description of the Prior Art

In raster-scan CRT video displays, an electron beam(s), is deflected and modulated to produce an image on the screen. Horizontal and vertical scan frequencies refer to the rate at which the beam can scan a single horizontal line or a complete screen respectively: bandwidth indicates how fast the beam can be turned on or off. These performance indices dictate the resolution of the display. Particular functions require different resolutions or screen formats, that is the number of characters or picture elements (pixels or pels) per line or horizontal lines per screen. The majority of systems are designed such that an individual display is configured for a particular screen format. However, many standards have evolved, and attempts have been made to provide one display capable of presenting data in several of such formats.

The NEC Multisync II (trademark) is an example of a multimode display, which can "lock into" a range of formats: however, picture height and centering need to be reset manually for each one. U.S. Pat. No. 4,574,279 describes a multiple format system in which horizontal and vertical scan frequencies are generated such that one of two formats can be selected, the same picture size being maintained by the application of one of two preset voltages to height adjustment circuits IBM Technical Disclosure Bulletin Vol. 28, No. 12, pages 5603-4, illustrates a method of increasing the number of vertical resolution modes of a display without altering the horizontal scan rate: the width of the video display enable signal, which corresponds to the number of horizontal lines displayed, is converted to a resistance value and used to control the vertical position of the beam.

Whilst it is clear, therefore, that multiformat displays do exist, nowhere in the prior art is the function fulfilled of automatic picture height and centering for a wide range of non-preset screen formats.

In raster video displays, the vertical position of the electron beam is controlled by the generation of deflection voltage signals, the voltage value varying with time. A change in format could involve, for example, varying the duration of the active video time when data is actually being displayed on screen.

SUMMARY OF THE INVENTION

The essence of the present invention is to provide means for automatically modifying the vertical deflection signal such that the deflection voltages at the start and end of the active video time are the same for differing screen formats; that is the top and bottom margins of the picture as displayed remain constant.

According to one aspect of the present invention, automatic picture height and centering for different screen formats is achieved by providing apparatus and method for controlling the vertical scan of a display having a scan frequency signal and an active video signal, the duration of which, corresponds to the active video time comprising means for generating a deflection voltage signal;
means for generating signal pulses indicating when active video time has started and ended;
means to store the deflection voltage at the start of active video time;
means to compare said stored deflection voltage to a reference voltage and subsequently to control the deflection voltage on flyback such that a desired relationship is maintained between the two voltages;
means to store the deflection voltage at the end of active video time; and
means to compare said stored deflection voltage to another reference voltage and subsequently to modify the deflection voltage signal such that a desired relationship is maintained between the two voltages.

According to another aspect of the invention a method is provided for controlling the position of a raster picture by comparing the deflection voltages at the start and end of active video time, to a first and second reference voltage respectively, and subsequently to modify the deflection signal so that desired relationships are maintained between these deflection voltages and their corresponding reference voltages.

BRIEF DESCRIPTION OF THE DRAWINGS

A specific example of the invention will now be described in detail with reference to the accompanying diagrams, in which.

DESCRIPTION OF THE PREFERRED EMBODIMENT

Figure 1:
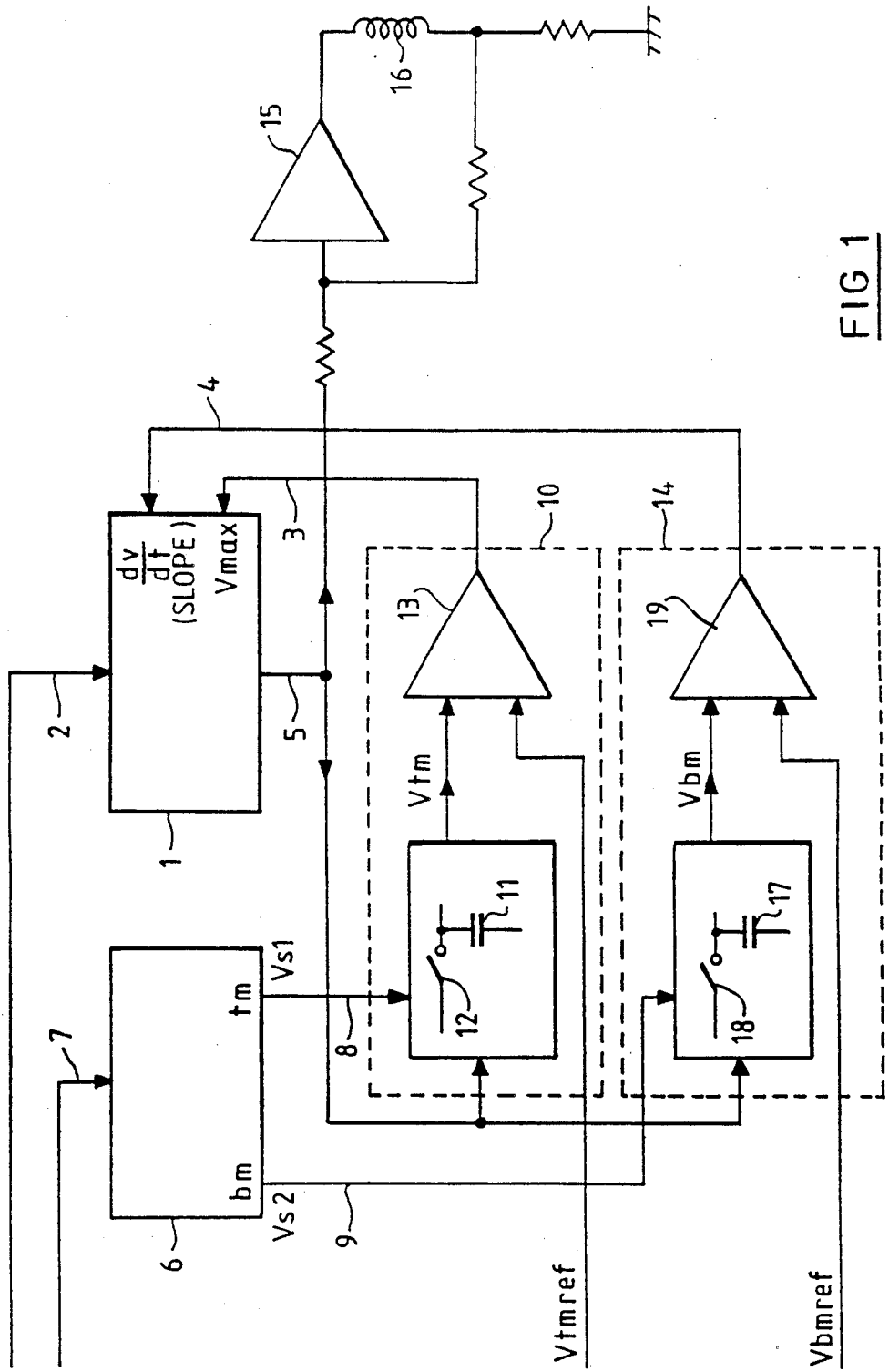
FIG. 1 is a block diagram of a vertical scan system.

FIG. 1 includes a ramp generation circuit (1) (see also FIG. 3) configured to accept three inputs:

(a) a vertical synchronization signal on line 2 to start the flyback action.

(b) a control signal on line 3 to control the level at which the ramp flyback ends and forward scanning begins, and (c) a control signal on line 4 to enable the forward slope of the scanning ramp to be varied.

Figure 2:
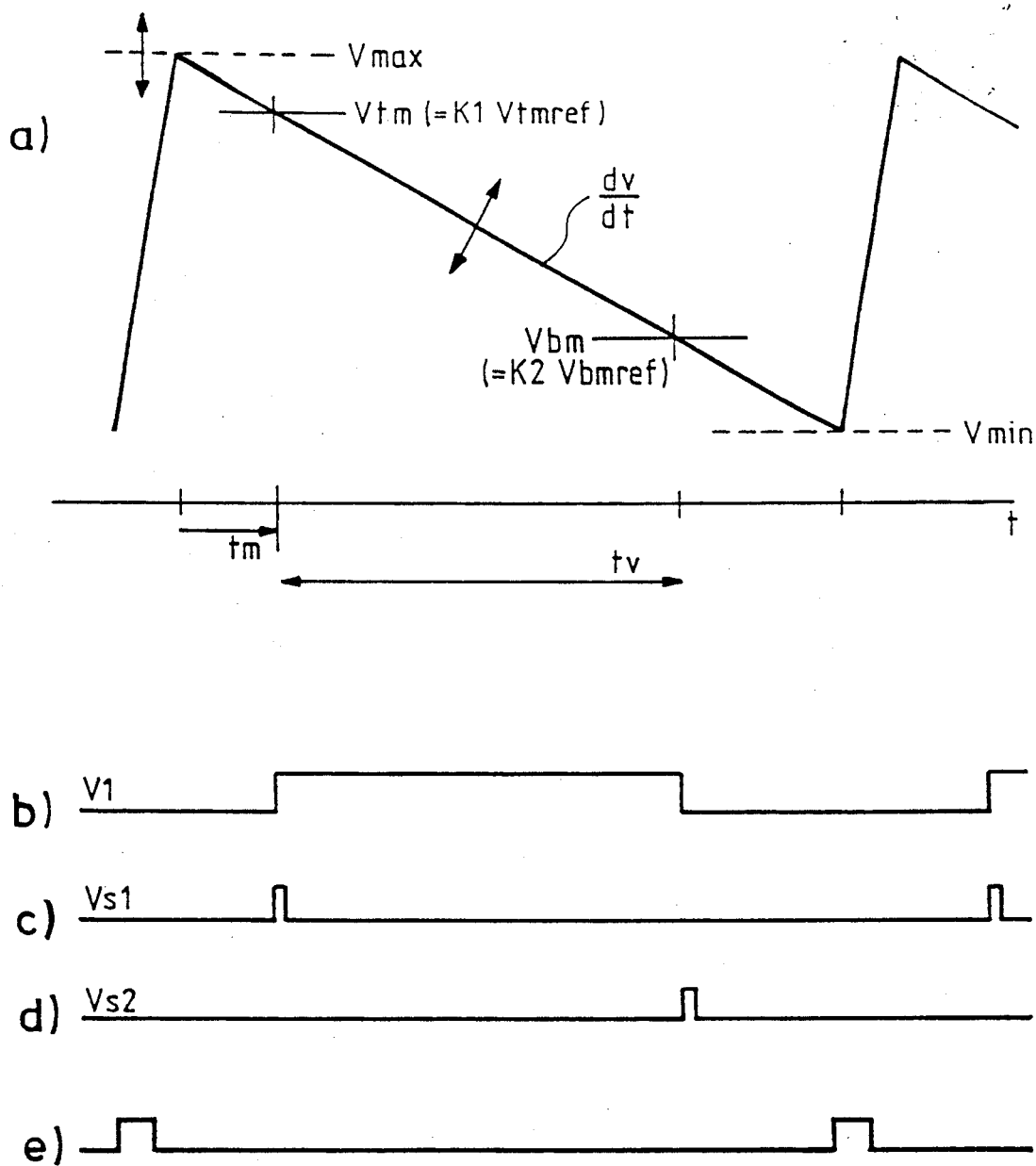
FIG. 2 shows the waveforms generated by the circuit blocks of FIG. 1. K1 and K2 are constants.
Figure 3:
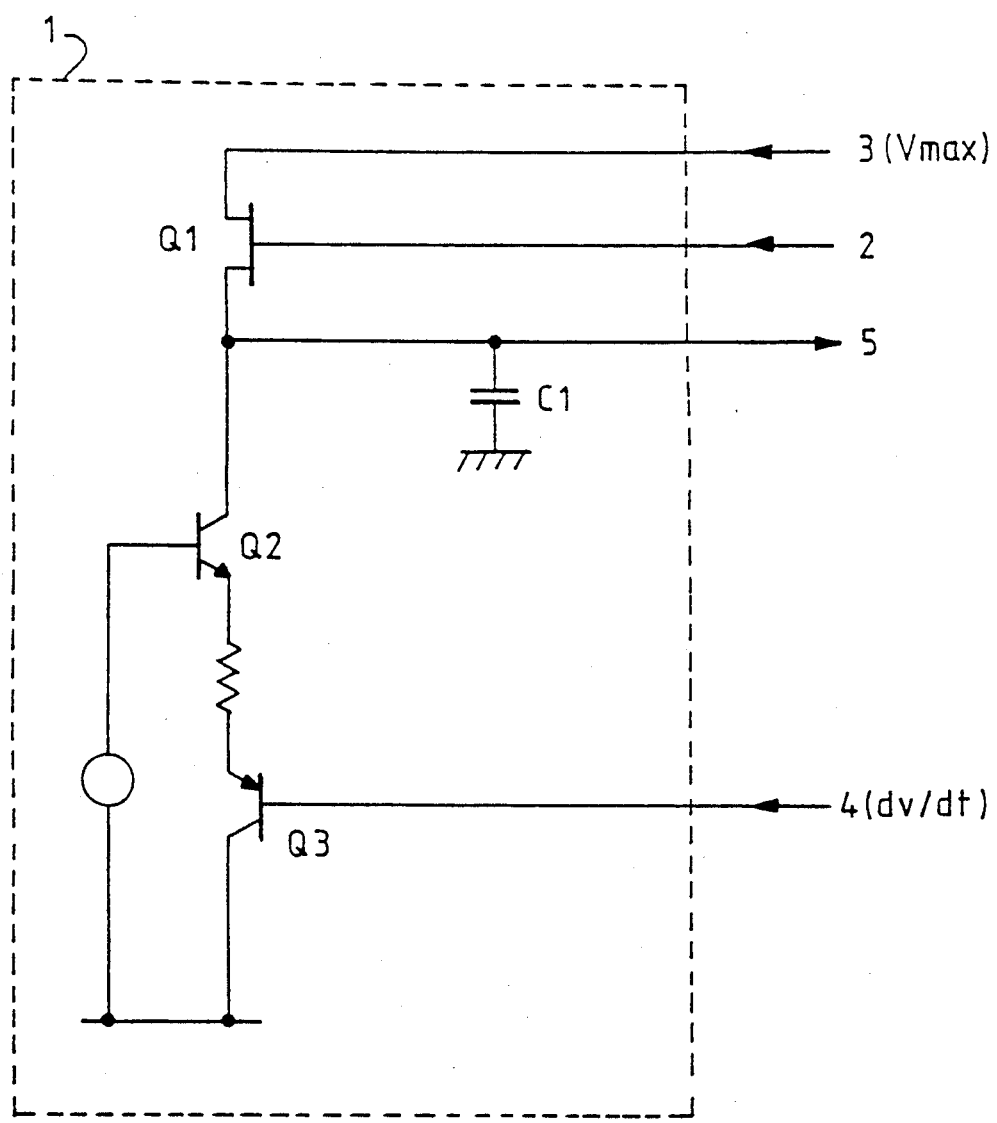
FIG. 3 shows a typical ramp generation circuit.

The output (5) of the ramp generation circuit (1) (see FIG. 3) is a ramp voltage as shown in FIG. 2a. This ramp voltage starts at a maximum voltage level of Vmax, set by the control input. The voltage decreases or "ramps down" with time (t), until tm (the so-called "back porch" time) when it reaches a voltage Vtm corresponding to the top margin of the video picture as displayed. After a further time period tv the ramp reaches a voltage level of Vbm, corresponding to the bottom margin of the video picture as displayed. The ramp voltage continues to fall to a voltage Vmin, at which time the vertical sync pulse (FIG. 2e) resets the ramp and the cycle continues. By controlling the level of Vmax and the forward scanning slope (dv/dt), it can be seen that the levels of Vtm and Vbm can also be controlled. A typical ramp generation circuit is shown in FIG. 3. It produces a ramp by using a constant current source using an NPN transistor (Q2) and a PNP transistor (Q3) to discharge a capacitor (CI). The constant current source is in turn controlled by the dv/dt input (4). The ramp is reset by a field-effect transistor switch (Q1) which, when triggered by the vertical sync signal (FIG. 2e), recharges the capacitor (C1) to the voltage, Vmax, as controlled by the second input (3).

Figure 4:
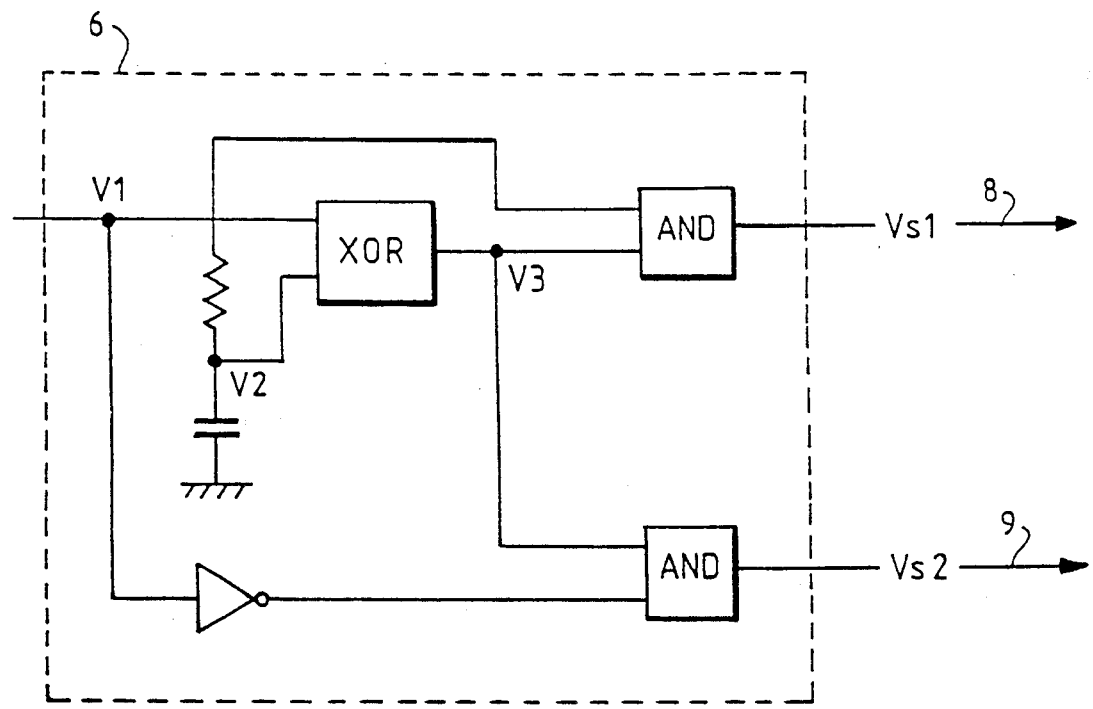
FIG. 4 illustrates a circuit for generating top and bottom margin pulses from a video duty cycle signal.
Figure 5:
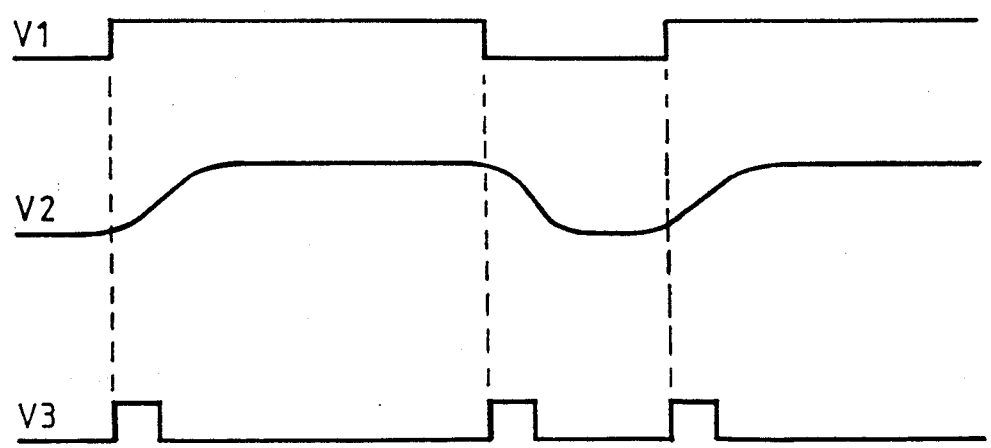
FIG. 5 shows the waveforms generated by the circuit shown in FIG. 4.

A second block shown in FIG. 1 is that of the video duty cycle signal processor (6) (see FIG. 4). The video duty cycle signal (VI), which can be seen in FIGS. 2b and 5, indicates when data is being presented on the screen. This signal can be sent directly from the logic on line 7 or, in an alternative embodiment of the invention not shown, can be coded into the vertical sync signal (FIG. 2e), on line 2, and separated by the block (6) to produce the vertical video duty cycle signal. This is processed by the duty cycle signal processor, a typical circuit and associated waveforms being shown in FIGS. 4 and 5 respectively, to produce two signals as shown in FIGS. 2c and 2d, a short pulse Vs1 on line 8 indicating the time video starts (the beginning of active video time), and a pulse Vs2 on line 9, indicating when the video ends, (the end of active video time).

A top margin control circuit (10) which supplies the control signal on line 3 has three inputs:
(a) the video signal start (Vs1), on line 8,
(b) the output signal of the ramp generator on line 5, and
(c) a variable reference voltage (Vtmref)

In order for the top and bottom of the picture to remain in the same place for different screen formats, reference voltages Vtmref and Vbmref are defined. These are, or have a known relationship to, the deflection voltage values that correspond to the desired top and bottom of the screen region where data is actually to be displayed. They can be varied, depending on the physical screen size of the monitor but, once set, would be constant for a particular display.

The ramp signal on line 5 is fed into a capacitor (11) via switch (12) activated during the video start time pulse. This forms a sample and hold circuit, storing the value of the ramp voltage at the time Ttm, this being the level of the top margin voltage Vtm. This is fed into a differential amplifier (13) that compares this voltage to the reference voltage, Vtmref. The difference between these constitutes an error signal that is amplified with appropriate frequency compensation and is fed back on line 3 to the ramp generator to control the maximum voltage after flyback.

A similar "sample, hold and control" circuit (14) controls the bottom margin, wherein it is fed with the video end signal Vs2 on line 9 and samples the ramp voltage at the time (Ttm+Tv), thus sampling the level of Vbm. This is again compared to a second reference voltage Vbmref, the resulting output being fed back on line 4 to control the ramp slope (dv/dt). By controlling both the slope and the Vmax on flyback, the same relationships between Vtm and Vtmref and between Vbm and Vbmref can be maintained automatically for a wide-range of screen formats.

In this fashion the above circuit blocks 1, 6, 10 and 14 operating together form a dual control system capable of maintaining accurate height and picture position over a wide range of formats. The ramp voltage on line 5, is coupled via a DC amplifier (15) to the vertical deflection yoke (16) of a display, the vertical scan frequency range employed being from 30 Hz to 100 Hz.

Despite there being additional circuitry in the system described compared to a basic vertical deflection stage, its complexity and component count are very similar to a multiple fixed mode scan circuit which requires demultiplexors and multiple adjustments, or close tolerance resistor networks. The performance of the present system is also theoretically more accurate than a multiple fixed mode scan circuit and has the additional advantage of being unlimited for use with future or specialized format standards. Being of low power signal operation, this circuit function could readily be incorporated into an integrated circuit. The references to top and bottom margins, being of DC nature, could be controlled by digital to analogue converters if a digital set up procedure were required.

Although a vertical scan circuit has been described, it is obvious that the same principles could also be applied to the horizontal scan circuit, the reference to top and bottom of the picture being replaced by reference to the left and right hand margins.

Having thus described my invention, what I claim as new and desire to secure by Letters Patents is:

1. An apparatus for controlling the vertical scan of a display having a scan frequency signal and an active video time signal, the duration of which corresponds to the active video time comprising:
   means for generating a deflection voltage signal;
   means for generating signal pulses (Vs1 and Vs2) indicating when active video time has started and ended;
   means for storing the deflection voltage (Vtm) at the start of active video time;
   means for comparing said stored deflection voltage (Vtm) to a reference voltage (Vtmref) and subsequently to control the deflection voltage on flyback such that a desired relationship is maintained between the two voltages;
   means for storing the deflection voltage (Vbm) at the end of active video time; and
   means for comparing said stored deflection voltage (Vbm) to another reference voltage (Vbmref) and subsequently to modify the deflection voltage signal such that a desired relationship is maintained between the two voltages.

2. The apparatus as claimed in claim 1, wherein said means for generating a deflection voltage signal includes a ramp generation circuit.

3. The apparatus as claimed in claim 1, wherein said means for generating signal pulses (Vs1, Vs2) includes a video duty cycle signal processor coupled to said active video time signal.

4. The apparatus as claimed in claim 1, wherein said means for storing the deflection voltage (Vtm) at the start of active video time includes a capacitor fed via a switch activated by said signal pulse (Vs1).

5. The apparatus as claimed in claim 1, wherein said means for storing the deflection voltage (Vbm) at the end of active video time includes a capacitor fed via a switch activated by the said signal pulse (Vs2).

6. The apparatus as claimed in claim 1, wherein said means for comparing said stored deflection voltage (Vtm) includes a differential amplifier.

7. The apparatus as claimed in claim 1, wherein said deflection voltage signal is coupled via a DC amplifier to a vertical deflection yoke.

8. The apparatus as claimed in claim 1, wherein the scan frequency is within the range from 30 Hz to 100 Hz.

9. A method for controlling the position of a raster picture comprising the steps of comparing the deflection voltages at the start (Vtm) and end (Vbm) of active video time, to a first (Vtmref) and second (Vbmref) reference voltage respectively, and modifying the deflection signal so that desired relationships are maintained between these deflection voltages and their corresponding reference voltages.

10. A method for controlling the vertical scan of a display comprising the steps of:
   controlling the scan frequency;
   generating an active video time signal, the duration of which corresponds to the active video time;
   generating a deflection voltage signal;
   generating signal pulses (Vs1 and Vs2) indicating when active video time has started and ended;
   storing the deflection voltage (Vtm) at the start of active video time;
   comparing said stored deflection voltage (Vtm) to a reference voltage (Vtmref) and subsequently to control the deflection voltage on flyback such that a desired relationship is maintained between the two voltages;
   storing the deflection voltage (Vbm) at the end of active video time; and comparing said stored deflection voltage (Vbm) to another reference voltage (Vbmref) and subsequently to modify the deflection voltage signal such that a desired relationship is maintained between the two voltages.

* * * * *